(12) United States Patent
Surya et al.

(10) Patent No.: US 11,282,654 B2
(45) Date of Patent: Mar. 22, 2022

(54) METHOD OF PREPARING PEROVSKITE MATERIAL AND SOLAR CELL CONTAINING IT AS A LIGHT ABSORBER

(71) Applicant: NAZARBAYEV UNIVERSITY RESEARCH AND INNOVATION SYSTEM, Nur-Sultan (KZ)

(72) Inventors: Charles Surya, Nur-Sultan (KZ); Annie Ng, Nur-Sultan (KZ); Zhiwei Ren, Nur-Sultan (KZ)

(73) Assignee: NAZARBAYEV UNIVERSITY RESEARCH AND INNOVATION SYSTEM, Nur-Sultan (KZ)

( * ) Notice: Subject to any disclaimer, the term of this patent is extended or adjusted under 35 U.S.C. 154(b) by 111 days.

(21) Appl. No.: 16/516,584

(22) Filed: Jul. 19, 2019

(65) Prior Publication Data
US 2020/0335285 A1     Oct. 22, 2020

(30) Foreign Application Priority Data
Apr. 22, 2019  (KZ) ................. 2019/0286.1

(51) Int. Cl.
*H01G 9/20*       (2006.01)
*H01L 51/42*      (2006.01)
*H01L 51/00*      (2006.01)

(52) U.S. Cl.
CPC ......... *H01G 9/2009* (2013.01); *H01G 9/2027* (2013.01); *H01L 51/0007* (2013.01); *H01L 51/4253* (2013.01)

(58) Field of Classification Search
CPC ...... H01L 51/00–56; H01L 51/42–448; H01G 9/20–2095
See application file for complete search history.

(56) References Cited

U.S. PATENT DOCUMENTS

2017/0084400 A1* 3/2017 Cheng .................. C30B 29/12
2017/0338045 A1* 11/2017 Vak .................... H01L 27/302
2018/0261396 A1* 9/2018 Gotanda ............ H01L 51/5032

FOREIGN PATENT DOCUMENTS

CN      109545975 A  *  3/2019
CN      110600616 A  *  12/2019

OTHER PUBLICATIONS

Ng, et al. "Cryo-controlled Nucleation Method for High-efficiency Perovskite Solar Cells." 2018 IEEE 7th World Conference on Photovoltaic Energy Conversion (WCPEC)(A Joint Conference of 45th IEEE PVSC, 28th PVSEC & 34th EU PVSEC). IEEE, 2018.*
Ng, et al. "Novel Cryo-controlled Nucleation Technique for High-efficiency Perovskite Solar Cells." 2018 IEEE International Conference on Electron Devices and Solid State Circuits (EDSSC). IEEE, 2018.*

(Continued)

*Primary Examiner* — William E McClain
(74) *Attorney, Agent, or Firm* — The Roy Gross Law Firm, LLC; Roy Gross

(57) ABSTRACT

Methods and systems of producing perovskite material, in which the nucleation and crystallization processes are decoupled and, hence, independently controlled resulting in highly uniform nucleation sites for subsequent crystallization of perovskites. Methods and systems for using perovskite material and mixed perovskite films for solar cells.

15 Claims, 5 Drawing Sheets

(56) References Cited

OTHER PUBLICATIONS

Ng, et al. "Strategies for high-performance perovskite solar cells." Oxide-based Materials and Devices X. vol. 10919. International Society for Optics and Photonics, 2019.*

Conings, et al. "A universal deposition protocol for planar heterojunction solar cells with high efficiency based on hybrid lead halide perovskite families." Advanced Materials 28.48 (2016): 10701-10709.*

Ren, et al. "Temperature-assisted rapid nucleation: a facile method to optimize the film morphology for perovskite solar cells." Journal of Materials Chemistry A 5.38 (2017): 20327-20333.*

Tidhar, et al. "Crystallization of methyl ammonium lead halide perovskites: implications for photovoltaic applications." Journal of the American Chemical Society 136.38 (2014): 13249-13256.*

J. A. Carr, S. Chaudhary, "The identification, characterization and mitigation of defect states in organic photovoltaic devices: A review and outlook," Energy & Environmental Science, vol. 6, pp. 3414-3438, 2013.

Annie Ng et al., "A Cryogenic Process for Antisolvent-Free High-Performance Perovskite Solar Cells," Advanced Materials, pp. 1-4, Sep. 12, 2018.

\* cited by examiner

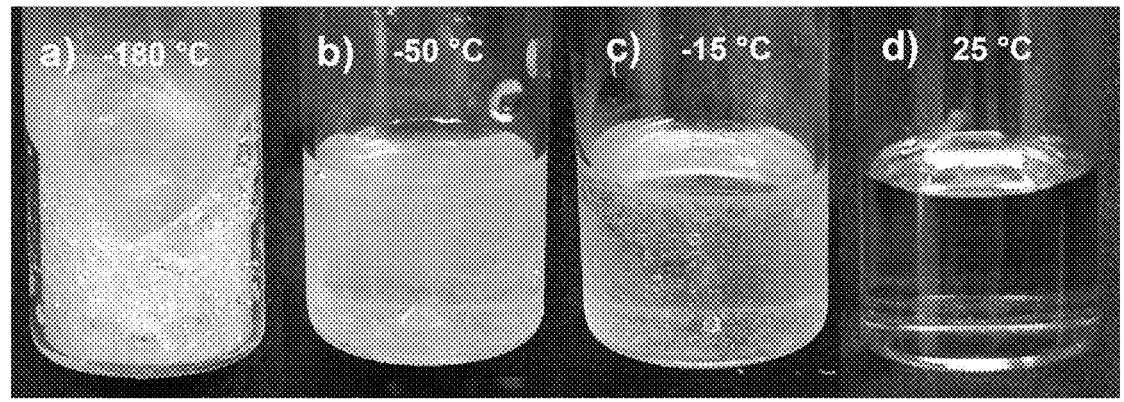
Figure 4. The appearance of the precursor solution under different temperatures
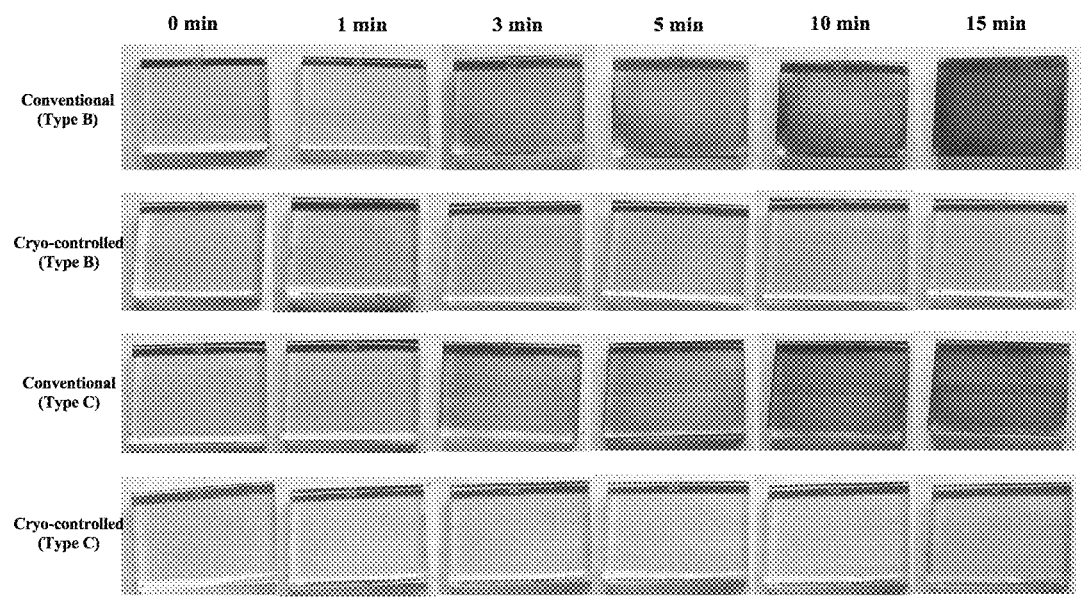
Figure 5. The appearance of the Type B and Type C precursor films prepared by the conventional method and the cryo-controlled nucleation technique at different time duration after spin-coating.

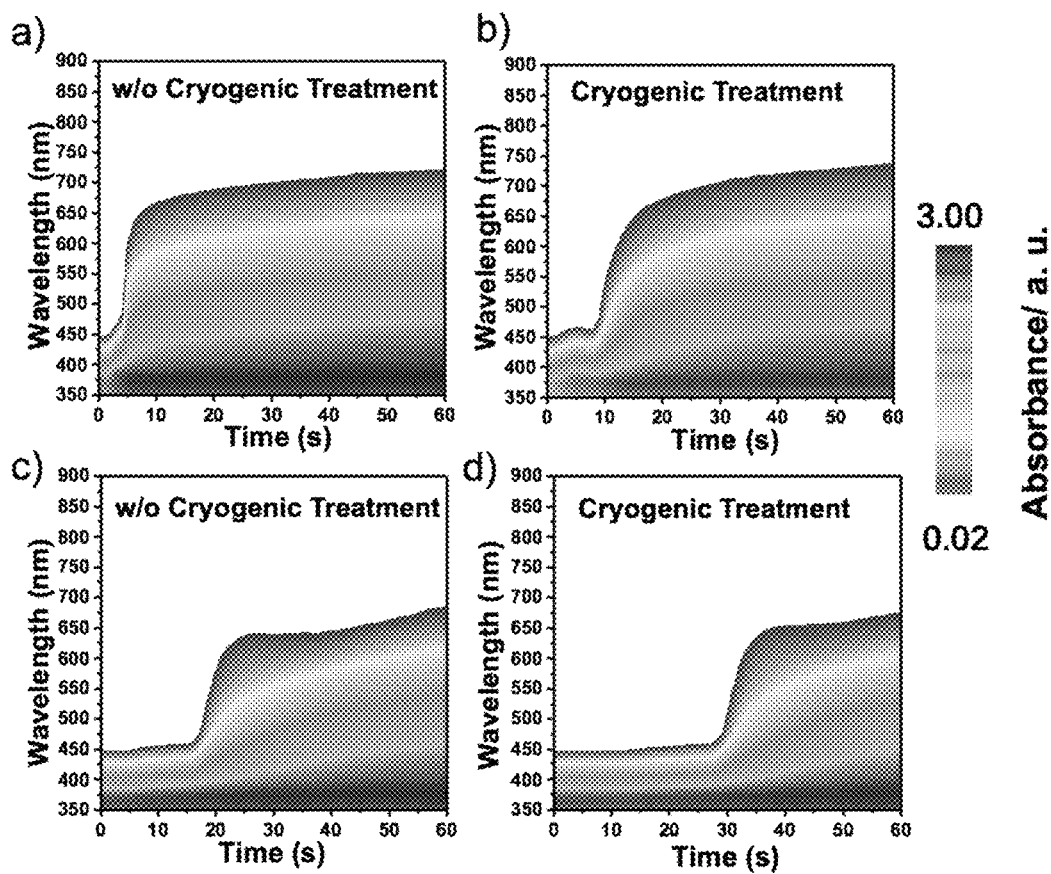
Figure 6. The results of dynamic absorption of the Type A precursor film without (a) or with (b) the cryogenic treatment followed by the blow-dry process. The results of dynamic absorption of the Type C precursor film without (c) or with (d) the cryogenic treatment followed by the blow-dry process

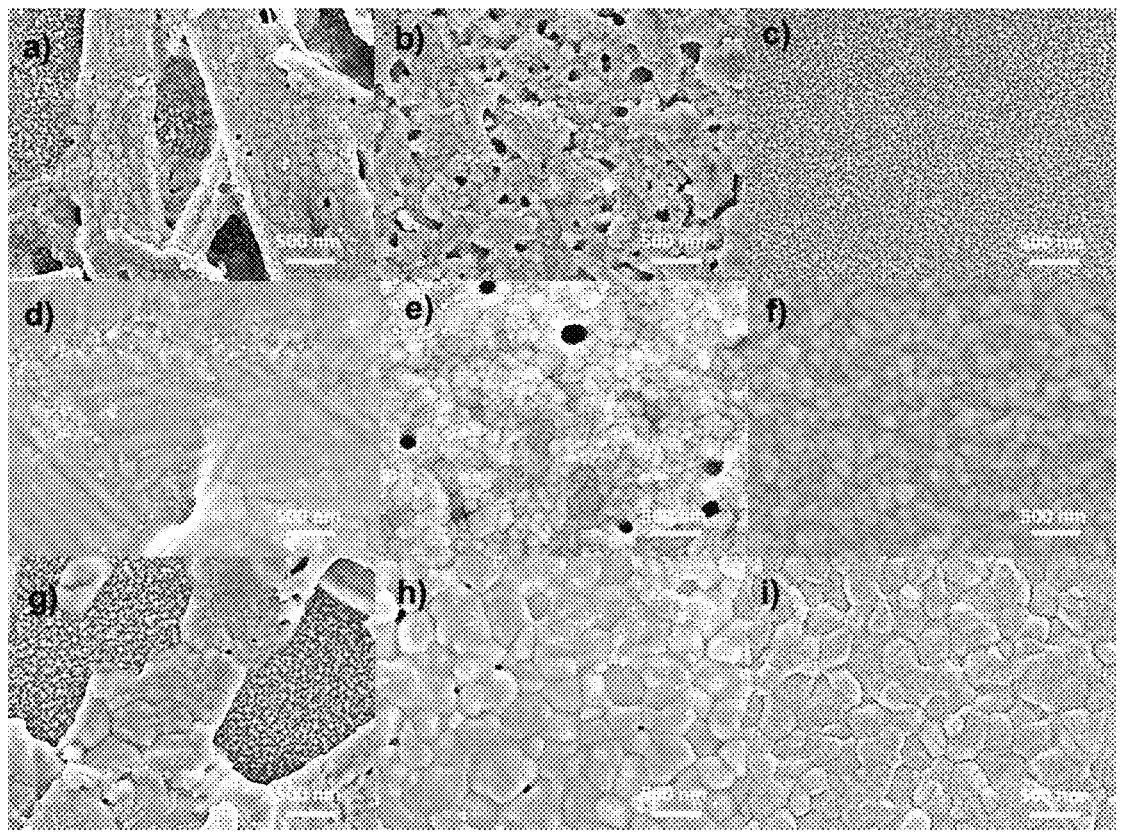
Figure 7. The SEM image of the morphology of the Type A (a, b, c), Type B (d, e, f) and Type C (g, h, i) perovskite films prepared by different methods. Direct thermal annealing (a, d, g); Blow dry and then thermal annealing (b, e, h); Cryo-controlled technique, blow dry process and then thermal annealing (c, f, i).

METHOD OF PREPARING PEROVSKITE MATERIAL AND SOLAR CELL CONTAINING IT AS A LIGHT ABSORBER

FIELD OF THE INVENTION

The present invention belongs to the field of solar cell technology. More particularly, the present invention relates to a processes of nano/micro structure growth, crystal growth for energy harvesting material for device (e.g. solar cell) application, also relates to temperature controlled processes for thin film/nano/micro structure growth and inorganic-organic perovskite materials, thin film solar cell, perovskite solar cell, crystal nucleation.

BACKGROUND OF THE INVENTION

Organometal halide perovskite-based solar cells (PSCs) have exhibited rapid enhancements in device power conversion efficiency (PCE) from 3.8% in 2009 to a recent record PCE of 23.3%. PSCs have tremendous potentials due to its impressive photovoltaic (PV) properties and low manufacturing cost. It is well known that the device performance critically depends on the film quality of the perovskite absorber layer. A variety of methods such as solution processing techniques, thermal evaporation, vapor assisted solution process and hybrid chemical vapor deposition are commonly employed by different research groups to grow perovskites. Recently, solvent engineering technique including the formation of Lewis acid-base adduct in the precursor films and introduction of anti-solvent dripping process are the mainstream for preparing solution based perovskite materials with excellent film morphology, yielding high performance PSCs. However, there are a number of limitations inherent to the technique. First, the resultant morphology of the perovskite films is strongly affected by a series of factors such as anti-solvents dripping time, volume, location of the samples and the type of the solvent used. The interplay of these factors largely reduces the batch to batch reproducibility, particularly for cases in large-scale fabrication. Second, the anti-solvent is applied during the spinning process, in which the anti-solvent washes away the common solvent, such as DMF, in the precursor layer. The process causes a supersaturation condition in the precursors and results in the formation of a uniform nucleation layer which is a critical condition for the crystallization of high quality perovskite films. However, it is challenging to apply the anti-solvent by dripping process on other types of large-scale solution processing techniques. Furthermore, the common anti-solvents used for preparing perovskites such as chlorobenzene, toluene and diethyl ether are environmentally harmful. The increase consumption and discharge volume of the anti-solvents for large-scale manufacturing should also be a concern.

The conventional method of 1-step-solution-processed perovskites usually involve straightforward spin-coating process followed by thermal annealing [M. Xiao, F. Huang, W. Huang, Y. Dkhissi, Y. Zhu, J. Etheride, A. Gray-Weale, U. Bach, Y.-B. Cheng and L. Spiccia, *Angewandte Chemie International Edition*, vol. 53, pp. 1-7, 2014. [11] J. A. Carr, S. Chaudhary, "The identification, characterization and mitigation of defect states in organic photovoltaic devices: A review and outlook," *Energy & Environmental Science*, vol. 6, pp. 3414-3438, 2013].

Tremendous research efforts had been devoted for optimizing the device architecture, as well as deposition techniques and composition of different layers, in particular the perovskite absorber. It is well known that high efficiency and good stability PSCs require certain desirable perovskite film properties such as low defect density, high crystallinity, good coverage, and uniformity. The perovskite films can be prepared by different methods, such as solution techniques, thermal evaporation, and a combination of vapor and the solution processes. The majority of the early works reported focused on simple 1-step or 2-step solution techniques. Difficulties in achieving good coverage and uniformity of perovskite films on the substrates in large scale are the main concerns of using these solution-based processes. To address these issues, solvent engineering and the use of antisolvent dripping were introduced. Solvent engineering approach relies on the use of a mixture of solvents, such as dimethylformamide (DMF) or 7-butyrolactone, with dimethylsulphoxide (DMSO), for the 1-step spin-coating technique. This enables more controlled reaction between the perovskite precursors due to the formation of a $CH_3NH_3I$—$PbI_2$-DMSO intermediary phase. The main function of the DMSO was to retard the rapid reaction between $PbI_2$ and $CH_3NH_3I$ during solvent evaporation in the spinning step due to the interaction among Lewis base DMSO, iodide and Lewis acid $PbI_2$. At the final stage, the residual DMSO was removed by thermal annealing, resulting in perovskite films with high crystallinity and uniform grain distribution. The introduction of antisolvent assisted crystallization during spin-coating further improves the quality of the perovskite layer by promoting rapid nucleation due to the initiation of an instantaneous local supersaturation of the precursor solution on the spinning substrate, resulting in a uniform seed layer for the subsequent perovskite crystallization step. Thus, the use of antisolvents together with solvent engineering for the formation of intermediary phase has become the mainstream for preparing solution-based perovskite materials, yielding high-performance PSCs. However, commonly used antisolvents such as chlorobenzene or toluene are environmentally harmful and highly toxic. While there have been proposals to replace these solvents with less toxic and more environmentally benign alternatives, the use of different antisolvent does not address the issue of important limitations in the scalability of the antisolvent assisted crystallization. In this process, the perovskite film quality critically depends on the time, volume and position of the application of the antisolvent. Inaccurate control of the dripping process will cause gradients in oversaturation of the precursor solution, leading to spatially inhomogeneous nucleation of the perovskite and deteriorate the resultant film quality.

SUMMARY OF THE INVENTION

There is considerable interest in the development of novel deposition methods for high quality perovskite films, where nucleation and crystallization of the perovskite films are controlled without the use of antisolvent. Different techniques to achieve this have been proposed, such as vacuum-flash assisted solution process (VASP), flash infrared annealing, etc. While high efficiency PSCs (≈18%-20%) have been demonstrated, typically only one composition of the perovskite material is investigated. Due to increasing importance of mixed composition perovskite materials for high efficiency and improved stability PSCs, it is important to develop a simple, convenient, cost-effective, and reproducible technique applicable for the preparation of different perovskite materials.

In this work, was introduced a novel perovskite growth process, in which the nucleation and crystallization processes are decoupled and, hence, independently controlled resulting in highly uniform nucleation sites for subsequent crystallization of perovskites. This is shown to be crucial for achieving high crystallinity in the perovskite films. Our method results in significant improvements in solar cell performance for three different compositions of mixed perovskite films, indicating general applicability to different perovskite materials.

Accordingly, the present invention is based on the summary of the prior art, by experimental studies, and finally completed the present invention.

The object of the present invention is to provide a solar cell containing perovskite material as a light absorber.

Another object of the present invention to provide a method for preparing perovskite material.

The technical result is a better absorption of light by the surface of the perovskite.

A method of producing perovskite material in which a precursor is applied by spin-coating onto a substrate and a uniform precursor film is obtained on the substrate, and the precursor deposition time is optimized to prevent premature crystallization due to excess evaporation of precursor solvents, and the precursor film is subsequently treated in a coolant bath and the solvent of the precursor is sharply frozen, then slowly increasing temperature of the substrate with a film to a temperature above the melting point of the solvent of the precursor, after which the substrate is successively subjected to a blow-dry process to remove residual solvents in the precursor film and finally the substrate is subjected to the thermal annealing to completely convert the precursor film into perovskite. The solvents used for preparing perovskite material can be a single solvent such as N,N-Dimethylformamide (DMF) or a mixture of solvents consists of N,N-Dimethylformamide (DMF) (melting point −61° C.) and Dimethyl sulfoxide (DMSO) (melting point 19° C.).

In one of the embodiments of this invention precursor consists of $CH_3NH_3I$, CH $(NH_2)_2I$, $CH_3NH_3Br$, CsI, $PbI_2$ and $PbBr_2$.

In one of the embodiments of this invention, solvent of the precursor is sharply frozen by decreasing temperature to about −180° C. or below.

In one of the embodiments of this invention temperature of the substrate with the film is increased slowly by blow dry process from −180° C. or below to the room temperature.

This invention also relates to perovskite material, which obtained according to the production method as described above.

This invention disclose the solar cell consisting of a substrate with an electron transport layer, on which a layer of perovskite material is sequentially placed, a hole transport layer (HTL) and electrodes deposited on the substrate.

In one of the embodiments of this solar cell the substrate with an electron transport layer composed of $SnO_2$ deposited on a glass coating with-fluorine doped Tin Oxide (FTO) using a sol-gel process.

In one of the embodiments of this solar cell the hole transport layer (HTL) was precipitated by spin-coating a solution consisting of 2,2',7,7'-Tetrakis[N,N-di(4-methoxyphenyl)amino]-9,9'-spirobifluorene (Spiro-MeOTAD) 80 mg/ml in chlorobenzene, with the addition of Lithium bis (trifluoromethanesulfonyl)imide (Li-TFSI) 17.5 µl from the original solution in concentrations of 520 mg/ml when dissolved in acetonitrile and 29 µl of 4-tert-Butylpyridine (tBP)_.

In one of the embodiments of this solar cell the electrode layer consists of gold (Au), applied by thermal evaporation through a shadow mask with a working active area of 0.03 $cm^2$.

BRIEF DESCRIPTION OF THE FIGURES

FIG. 4 are images of the precursor solution during the temperature reduction process.

FIG. 5 is appearance of the Type B and Type C precursor films prepared by the conventional method and the cryo-controlled nucleation technique at different time duration after spin-coating.

FIG. 6 shows results of dynamic absorption of the Type A precursor film.

FIG. 7 is SEM image of the morphology of the Type A (a, b, c), Type B (d, e, f) and Type C (g, h, i) perovskite films prepared by different methods.

DETAILED DESCRIPTION OF THE INVENTION

Figure 1:
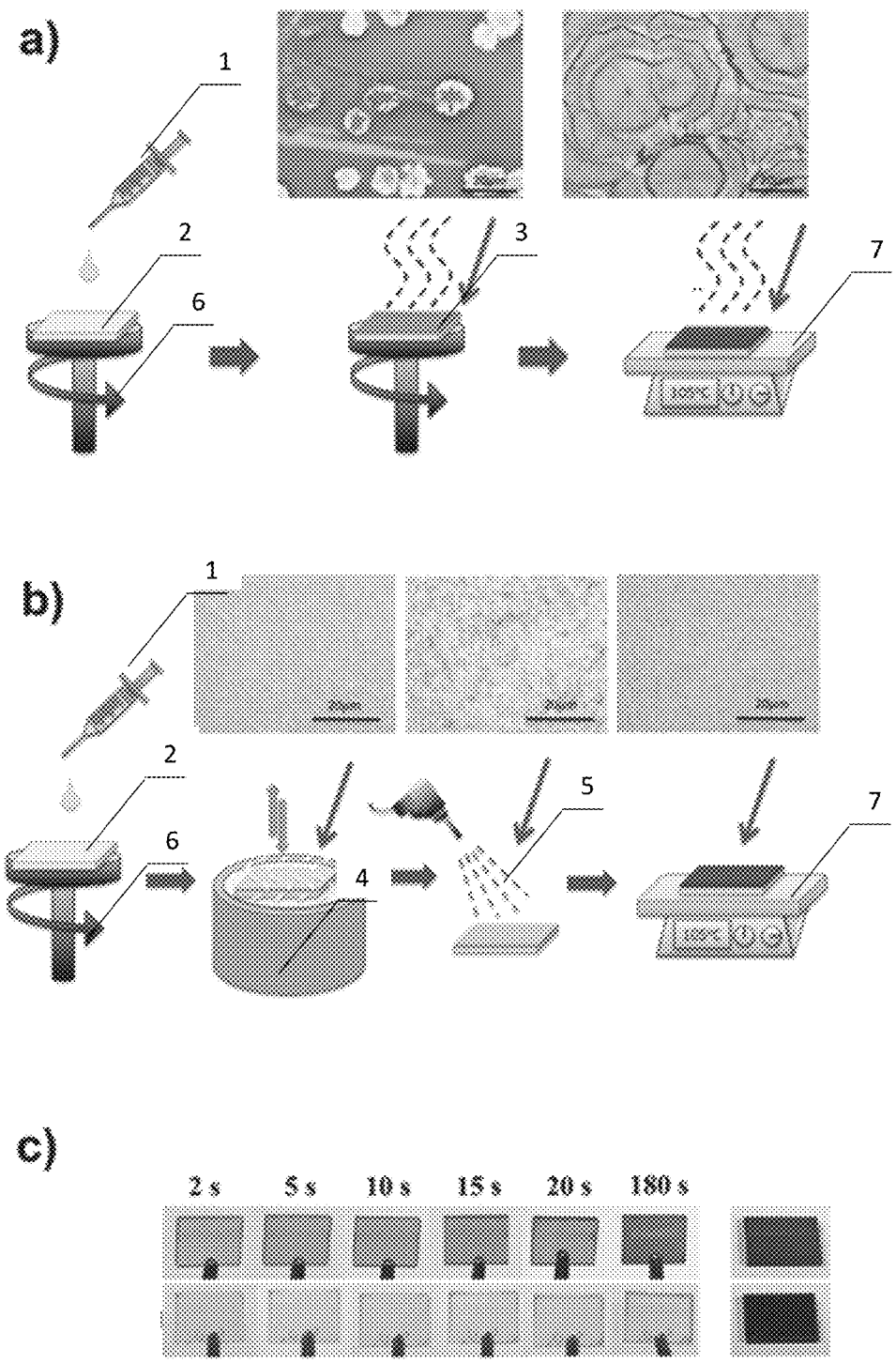
FIG. 1—The schematic diagrams showing: a) the conventional solution process and b) cryo-controlled nucleation technique for perovskite synthesis.
Figure 2:
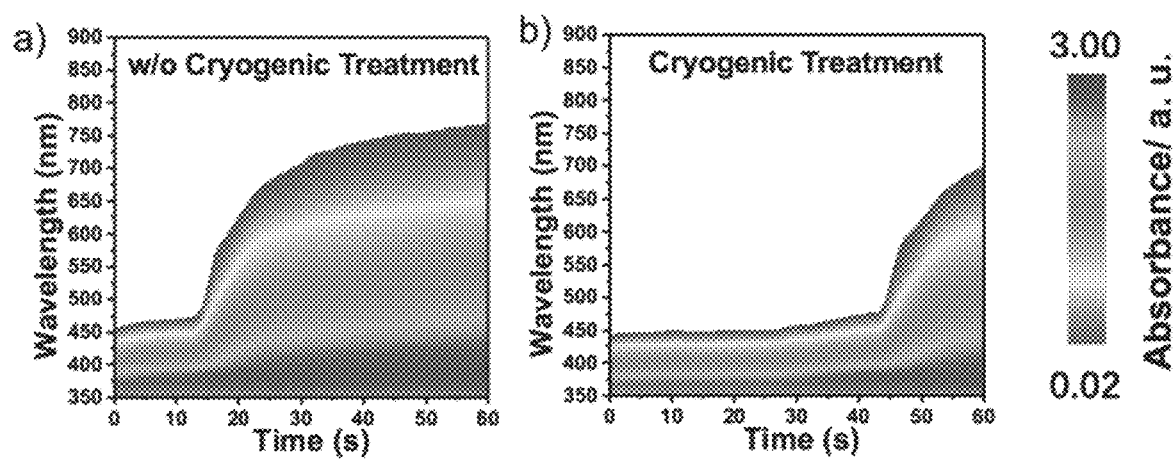
FIG. 2 a,b)—The results of dynamic absorption of the precursor film without (a) or with (b) the cryogenic treatment followed by the blow-dry process.
Figure 3:
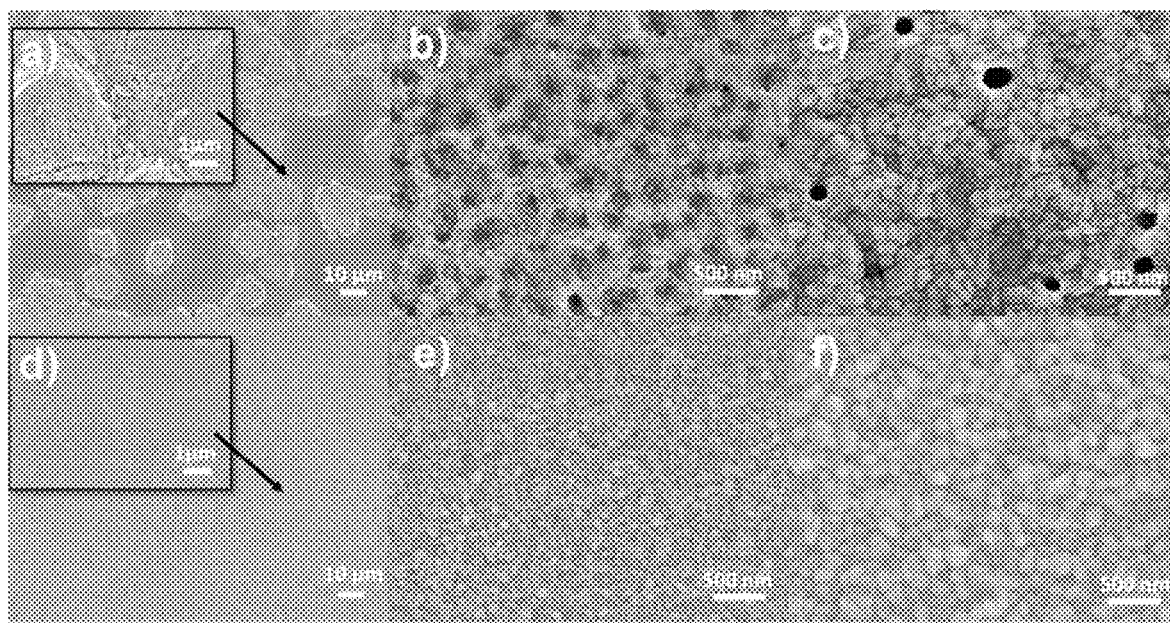
FIG. 3—The morphology of the precursor/perovskite films prepared by the solution processes with or without cryo-controlled technique.

In the FIGS. 1-3 shown the method of producing perovskite material in which a precursor (1) is applied by spin-coating (6) onto a substrate (2) and a uniform precursor film (3) is obtained on the substrate (2), and the precursor deposition time is optimized to prevent premature crystallization due to excess evaporation of precursor solvents, and substrate (2) with the precursor film (3) is subsequently treated in a coolant bath (4) and the solvent of the precursor is sharply frozen, then slowly increasing temperature of the substrate with a film to a temperature above the melting point of the solvent of the precursor, after which the substrate is successively subjected to a blow-dry process (5) to remove residual solvents in the precursor film and finally the substrate is subjected to the thermal annealing (7) to completely convert the precursor film into perovskite.

In particular embodiments of the invention:

The precursor solvent consists of a mixture of dimethylformamide and dimethyl sulfoxide, the precursor consists of $CH_3NH_3I$, CH $(NH_2)_2I$, $CH_3NH_3Br$, CsI, $PbI_2$ and $PbBr_2$, the temperature of the substrate with the film increases about −50°.

The claimed invention also relates to a solar cell panel consisting of a substrate with an electron transport layer, on which a layer of perovskite material produced by above-mentioned method is sequentially placed, a hole transport layer (HTL) and an electrode layer.

In particular embodiments of the solar cell panel:
the substrate with an electron transport layer composed of $SnO_2$ deposited on a glass coating with-fluorine doped Tin Oxide (FTO)—using a sol-gel process,
the hole transport layer (HTL) was precipitated by spin-coating a solution consisting of spiro-MeOTAD 80 mg/ml in chlorobenzene, with the addition of Li-TFSI 17.5 µl of the initial solution at a concentration of 520 mg/ml in the dissolved state in acetonitrile and 29 µl of t-BP, the electrode layer consists of gold (Au), applied by thermal evaporation through a shadow mask with a working active area of 0.03 cm².

In this invention developed a novel cryo-controlled nucleation technique, which effectively decouples the nucleation and crystallization phases and ensures the formation of a uniform seed layer for subsequent perovskite growth. The schematic diagrams shown in FIG. 1a,b indicate the differences between the conventional spin-coating process and the proposed perovskite growth technique. The conventional 1-step process for a mixed perovskite precursor solution can result in non-uniform films with poor morphology due to coalescence of perovskite crystallites resulting from rapid solvent evaporation from a complex solution of the constituents with different solubilities. FIG. 1a shows typical optical images of a mixed halide precursor and perovskite films $(Cs_{0.05}(MA_{0.17}FA_{0.83})_{0.95}Pb(I_{0.84}Br_{0.16})_3)$ that we used in this work. The inhomogeneous formation of large crystallites is observed in the precursor film during the spinning process and a very non-uniform perovskite film is obtained after thermal annealing. FIG. 1b illustrates our proposed material growth method, which is a 4-step process as detailed below: (i) spin-coating of the precursors; (ii) cryogenic treatment; (iii) blow-dry process for the removal of the solvent; and (iv) thermal annealing. First, the precursors were spin-coated onto a glass/fluorine-doped tin oxide (FTO)/$SnO_2$ substrate. The spin-coating time was optimized to provide a uniform precursor film while preventing premature crystallization caused by excessive spinning due to the evaporation of a large amount of solvent. Second, the as-cast precursor film was dipped into a liquid nitrogen ($LN_2$) bath immediately. This treatment had two significant impacts on the precursor film. The rapid reduction in temperature induced abrupt freezing of the solvent consisting of a mixture of DMF (m.p. −61° C.) and DMSO (m.p. 19° C.). The rapid solidification of the solvent at cryogenic temperature prevented chemical reaction and the coalescence of the precursors and, thereby, ensured the uniform distribution of the solutes. This phenomenon is demonstrated in FIG. 4, which shows the images of the precursor solution during the temperature reduction process. The rate of chemical reaction is described by the Arrhenius equation $k=Ae-Ea/(kBT)$, where k is the rate constant, T is the absolute temperature, A is a constant for chemical reaction that defines the rate due to the frequency of collisions in the correct orientation, Ea is the activation energy for the reaction, and $k_B$ is the Boltzmann constant. The Arrhenius equation illustrates strong temperature dependence of the chemical reaction rate which was substantially reduced by immersing the substrate in the $LN_2$ bath. If premature chemical reaction is not properly inhibited, large perovskite crystallites may be formed in the early stage and results in poor film morphology, which is irreversible even by introducing additional post-deposition treatments (e.g., thermal annealing). Third, upon removal from the $LN_2$, the temperature of the substrate increased slowly to above the melting point of the solvent, which is estimated to be roughly in the range of −50° C. in our case and the sample is subjected to a blow-dry process, using dry $N_2$, to facilitate the removal of the residual solvents in the precursor film before thermal annealing. A supersaturated condition was induced in the solution resulting in the uniform precipitation of the precursors over the entire substrate. It is important to point out that at this point the temperature of the substrate is still well below the temperature needed for chemical reactions, which prevents the coalescence of large pre-maturely formed perovskite crystallites. In addition, the blow-dry process is essential for rapid removal of residual solvents. If the films containing precursors with large amounts of residual solvents were directly annealed, the precursors would have re-dissolved in the solvent and will nullify all the effects of the cryogenic treatment. The resultant perovskite films will become very rough with a high density of pinholes as in the case of films processed using the conventional technique. Another important attribute of the proposed cryo-controlled technique is the ease of scalability of the cryogenic dipping and the blow-drying steps to large area substrates with high uniformity. Finally, the sample was subjected to a thermal annealing treatment to completely convert the precursors into the perovskite material. Using this 4-step process, we were able to obtain very smooth precursor/perovskite films with excellent coverage over the entire substrate as observed from the insets in FIG. 1b, which is very different from the films deposited using the conventional method as indicated in the insets of FIG. 1a.

FIG. 1. The schematic diagrams showing: a) the conventional solution process and b) cryo-controlled nucleation technique for perovskite synthesis. The inset figures are the images of the precursor and the perovskite films under an optical microscope. c) The appearance of the type A precursor films prepared by the conventional method and the cryo-controlled nucleation technique at different time duration after spin-coating.

To investigate the applicability of the proposed cryogenic process to a variety of different compositions of mixed perovskites, in this invention conducted detailed characterizations on the following three types of perovskite films:

(1) Type A precursor/perovskite films-$MA_xFA_{1-x}PbI_3$, where x is greater than 0 and less than 1, with the precursor recipe from Ding et al.;

(2) Type B precursor/perovskite films-$Cs_{0.05}(MA_{0.17}FA_{0.83})_{0.95}Pb(I_{0.84}Br_{0.16})_3$ in which Cs and Br were incorporated into the precursor solution in addition to the basic elements in Type A films. It is known that the introduction of tertiary (FA/MA/Cs) cations and binary (I/Br) halide anions in Type B perovskite can significantly enhance its thermal stability and suppress the formation of photoinactive nonperovskite phase (yellow phase) in the resultant film, leading to enhanced performances for the PSCs; and (3) Type C precursor/perovskite films-Cl is incorporated to the Type B precursor.

Both the conventional and cryo-controlled growth processes were applied to all three types of films. For Type A films grown using the conventional process, it was observed that the crystallization of the perovskite began in the early stage of spin-coating process resulting in a fast and short time window for the crystallization step. The as-cast precursor film was gray in color, which yields a perovskite film with high roughness and poor coverage after the thermal annealing process. From FIG. 1c, it is observed that there was a rapid change in the color of the Type A as-cast precursor film and, after thermal annealing, the resultant perovskite film had a very rough appearance. As for Type B and Type C precursor films, the time window was relatively longer compared to Type A precursor film. The as-cast precursor films were shiny at the beginning, but became rough and gray after 180 s. Hence, the conventional perovskite growth method was not optimized for preparing Type B and C perovskites as it yielded grey films with very poor coverage as shown in the photos in FIG. 5. With the proposed cryogenic process, the crystallization rate was substantially lowered and the time window for the film formation was lengthened for all three perovskite compositions. From FIG. 1c it is shown that the time window for film formation was significantly increased for Type A precursors. The cryogenic treatment was able to preserve the Type B and Type C precursor films in a shiny and smooth appearance for a longer time (>15 min) before carrying out the next processing step.

An in situ investigation of the 1-step spin-coating process of $MAPbX_3$ (X=I, Br, Cl) showed that the composition of the precursor solution has strong impact on the interaction between solvents and the solutes and thus alters the film casting dynamics during the spinning process, leading to the formation of ordered or disordered precursor solute phases. For most commonly used deposition recipes, the solvents tend to retain in the films and disrupt the precursor orders so that the quality of the resultant perovskite films may be influenced by a number of random factors, particularly for the processing conditions (e.g., concentration of solvents trapped in the glove box), resulting in diverse qualities for the perovskite materials even based on the same precursor formulation. Our proposed 4-step process is an effective strategy to reduce the impact caused by the solvent-solute interactions on the quality of the as-cast precursor films, which is particularly useful for mixed perovskites with high complexities in the composition. This is because the nucleation and crystallization phases are effectively decoupled during the perovskite growth.

The blow-dry process, similar to VASP and single gas quenching technique, relies on rapid residual solvent removal to control the film crystallization and improve uniformity. Adding the cryogenic treatment prior to blow-drying further enhances the decoupling of the nucleation and crystallization phases for the as-cast precursor films, yielding higher quality perovskite thin films after thermal annealing. To investigate the role of these two steps in the film formation, in this invention conducted a dynamic absorption measurement on the as-cast precursor films treated by the blow-dry process alone and one prepared by the cryogenic technique followed by the blow-dry process. FIG. 2 shows the comparison of the experimental results between these two types of samples based on Type B precursor films while the experimental results on Type A and Type C films are shown in FIG. 6. As observed in FIG. 2, the unreacted pale-yellow precursor films absorbed photons between the range of 350 to ≈450 nm. The increase in absorption beyond 450 nm indicates that chemical reactions had taken place between the precursors within the films leading to the formation of perovskite crystallites. It is clearly observed that the rate of conversion of the perovskite layer is more gradual for the sample treated with cryogenic process. Similar phenomena are also observed for the Type A and Type C samples (FIG. 6). The data show that chemical reactions between precursors and the evaporation of the residual solvents took place simultaneously. The low temperature ambient slows down the rate of precursor reaction and in the meantime the blow-dry process can effectively extract most of the residual solvent from the precursor films when the temperature increased, preventing the disordering of the precursor due to the melting of the residual solvents.

FIG. 2. a,b) The results of dynamic absorption of the precursor film without (a) or with (b) the cryogenic treatment followed by the blow-dry process.

Retardation of the rate of chemical reactions by the cryogenic step in the process is also clear from the film morphology. FIG. 3 shows the typical SEM images for the Type B films after each processing step: (i) as-cast precursor films with or without cryogenic treatment (FIG. 3d,a, respectively); (ii) the precursor films after the blow-dry process (FIG. 3b,e); and (iii) the final perovskite films after thermal annealing (FIG. 3c,f). As observed in FIG. 3a, substantial aggregation was observed for the as-cast precursor film without cryogenic treatment whereas a highly uniform precursor film was obtained for the cryogenically treated sample as shown in FIG. 3d. After the blow-dry process, the cryogenically treated film exhibited excellent coverage (FIG. 3e) compared to the control film which showed significant roughness and contained high concentration of pinholes (FIG. 3b). Due to the substantial differences in the morphology of precursor films, it is not surprising that the resultant perovskite films exhibited tremendous differences in quality after thermal annealing. The control perovskite film indicated poor coverage and high concentration of pinholes, as shown in FIG. 3c, whereas the perovskite film grown by the proposed 4-step technique indicated excellent film morphology (FIG. 3f).

FIG. 3. The morphology of the precursor/perovskite films prepared by the solution processes with or without cryo-controlled technique. a) The as-cast precursor film without cryogenic treatment, b) the precursor film without cryogenic treatment and after blow-dry process, c) the perovskite film obtained from thermally annealed precursor film in (b), d) the as-cast precursor film with cryogenic treatment, e) the precursor film with cryogenic treatment and after blow-dry process, and f) the perovskite film obtained from thermally annealed precursor film in (e).

It is known that the constituents used in the precursors greatly affect the dynamics of perovskite conversion. It is found that the average grain size of Type A perovskite film is substantially smaller compared to that of Type B films (FIG. 3f) since the rate of crystallization of Type A film is much faster than the Type B film during the thermal annealing stage leading to significantly shorter crystallization time. However, large grain size is desirable for high-performance PSCs, since films with larger grain size have fewer grain boundaries and lower trap density. In our previous work, in this invention shown that the crystallization time is substantially lengthened when the concentration of Cl in the precursor solution increases and the perovskite grain size is proportional to the crystallization time. Furthermore, Bouchard et al. utilized synchrotron X-ray diffraction microscopy to obtain direct evidence for chlorine-induced preferential crystalline orientation leading to the growth of larger perovskite crystallites on $TiO_2$. Thus, we considered modification of the precursor solution composition by adding Cl to further increase the grain size of the perovskite (Type C). Our experimental data show that the crystallization rates for the three types of perovskites in this work are: Type A>Type B>Type C, with a strong impact on the average grain size as observed in the corresponding films: Type A<Type B<Type C, as clearly shown in the SEM images in FIG. 3f, and FIG. 7,f,I.

A novel 4-step cryo-controlled method for the deposition of high quality mixed perovskite films without the use of antisolvents has been demonstrated. This method results in increased grain size and crystallinity and lower defect density for all three different perovskite compositions investigated. Thus, the method has universal applicability and it is readily scalable to larger device areas. The improved film quality and consequently increased PCE result from decoupling of the nucleation and crystallization phases during the conversion of perovskite from precursors. Processing at cryogenic temperature suppresses premature reactions of the precursors and prevents premature coalescence of nuclei into large crystallites, enabling uniform film formation following the blow-drying and annealing steps. The method is of particular interest for Cs-containing perovskite formulations, since it is shown to successfully suppress the formation of the undesirable yellow phase δ-CsPbI$_3$. Using this method, a champion PCE of 21.4% with a $V_{OC}$=1.14 V, $J_{SC}$=23.5 mA cm$^{-2}$, and FF=0.80 can be achieved for optimized perovskite composition.

The invention claimed is:

1. A cryo-controlled nucleation method of producing perovskite material comprising:
spin-coating a precursor onto a substrate to obtain a uniform precursor film on the substrate, whereby the precursor spin coating deposition time is optimized to prevent premature crystallization due to excess evaporation of precursor solvents;
subsequently treating the precursor film in a coolant bath, thereby sharply freezing the solvent containing solutes of the precursor;
increasing temperature of the substrate with the precursor film to a temperature above the melting point of the solvent of the precursor;
successively subjecting the substrate to a blow-dry process to remove residual solvents in the precursor film; and
subjecting the substrate to thermal annealing to completely convert the precursor film into perovskite.

2. The method of claim 1, wherein the precursor solvent consists of a mixture of dimethylformamide and dimethyl sulfoxide.

3. The method of claim 1, wherein the precursor consists of CH$_3$NH$_3$I, CH (NH$_2$)$_2$I, CH$_3$NH$_3$Br, CsI, PbI$_2$, PbBr$_2$, and PbCl$_2$.

4. The method of claim 3, wherein the concentration/amount of the precursor ranges from 0 M to 1.2 M.

5. The method of claim 1, wherein the temperature of the substrate with the film increases about 50° C. from the step of treating the precursor film in the coolant bath to the step of subjecting the substrate to the blow-dry process.

6. The method of claim 1, wherein the solvent of the precursor is sharply frozen by decreasing temperature to around −180° C. or below.

7. The method of claim 1, wherein the temperature of the substrate with the film is increased slowly by blow dry process from around −180° C. or below to the room temperature.

8. The method of claim 1, wherein the substrate is a glass/fluorine-doped tin oxide (FTO)/SnO$_2$ substrate.

9. The method of claim 1, wherein the coolant bath is a liquid nitrogen (LN$_2$) bath.

10. The method of claim 1, wherein the rapid solidification of the solvent at cryogenic temperature prevented chemical reaction and the coalescence of the precursors.

11. The method of claim 1, wherein the perovskite is precursors/perovskite film (CH$_3$NH$_3$)$_x$ (CH (NH$_2$)$_2$)$_{1-x}$PbI$_3$, where x is in the range higher than 0 but smaller than 1.

12. The method of claim 1, wherein the perovskite is precursors/perovskite film —Cs$_{0.05}$ ((CH$_3$NH$_3$)$_{0.17}$(CH (NH$_2$)$_2$)$_{0.83}$)$_{0.95}$ Pb(I$_{0.84}$Br$_{0.16}$)$_3$.

13. The method of claim 1, wherein the perovskite is precursors/perovskite film having Cl incorporated to Cs$_{0.05}$ ((CH$_3$NH$_3$)$_{0.17}$(CH (NH$_2$)$_2$)$_{0.83}$)$_{0.95}$ Pb(I$_{0.84}$Br$_{0.16}$)$_{3-y}$ Cl$_y$, where y is in the range higher than 0 but smaller than 1.

14. The method of claim 1, wherein the nucleation and crystallization phases are effectively decoupled during the perovskite growth.

15. The method of claim 14, wherein the step of increasing temperature of the substrate with the precursor film prior to successively subjecting the substrate to a blow-dry process to remove residual solvents in the precursor film enhances the he decoupling of the nucleation and crystallization phases for the as-cast precursor films, yielding higher quality perovskite thin films after thermal annealing.

* * * * *